US008288321B2

(12) United States Patent
Hosono et al.

(10) Patent No.: US 8,288,321 B2
(45) Date of Patent: Oct. 16, 2012

(54) LAYERED COMPOUND, SUPERCONDUCTOR AND METHOD FOR PRODUCING SAME

(75) Inventors: Hideo Hosono, Kanagawa (JP); Hiroshi Yanagi, Tokyo (JP); Toshio Kamiya, Kanagawa (JP); Satoru Matsuishi, Tokyo (JP); Sungwng Kim, Kanagawa (JP); Seok Gyu Yoon, Kanagawa (JP); Hidenori Hiramatsu, Kanagawa (JP); Masahiro Hirano, Tokyo (JP); Takatoshi Nomura, Tokyo (JP); Yoichi Kamihara, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 41 days.

(21) Appl. No.: 13/003,149

(22) PCT Filed: Jul. 9, 2009

(86) PCT No.: PCT/JP2009/062500

§ 371 (c)(1),
(2), (4) Date: Jan. 7, 2011

(87) PCT Pub. No.: WO2010/007929

PCT Pub. Date: Jan. 21, 2010

(65) Prior Publication Data

US 2011/0111965 A1    May 12, 2011

(30) Foreign Application Priority Data

Jul. 16, 2008    (JP) .................................. 2008-184843

(51) Int. Cl.
*C04B 35/45* (2006.01)
(52) U.S. Cl. ....................................... 505/123; 505/461

(58) Field of Classification Search ................... 505/123, 505/461, 500, 742; 501/151; 420/581, 590; 423/464
See application file for complete search history.

(56) References Cited

U.S. PATENT DOCUMENTS 5,286,712 A * 2/1994 Fujita et al. .................... 505/125
(Continued)

FOREIGN PATENT DOCUMENTS

GB        301690 A2 * 2/1989
(Continued)

OTHER PUBLICATIONS

Matsuishi, Satoru et al. "Cobalt-Substitution-Induced Superconductivity in a New Compound with ZrCuSiAs-Type Structure, SrFeAsF," Journal of the Physical Society of Japan, Nov. 2008, vol. 77, No. 11, p. 113709-1 - 113709-3, cited in Isr.

(Continued)

*Primary Examiner* — Colleen Dunn
(74) *Attorney, Agent, or Firm* — Westerman, Hattori, Daniels & Adrian, LLP

(57) ABSTRACT

Provides a new non-oxide system compound material superconductor as an alternative of the perovskite type copper oxides superconductor.

Layered compounds which are represented by chemical formula AF(TM)Pn (wherein, A is at least one selected from a group consisting of the second family elements in the long form periodic table, F is a fluorine ion, TM is at least one selected from a group of transition metal elements consisting of Fe, Ru, Os, Ni, Pd, and Pt, and Pn is at least one selected from a group consisting of the fifteenth family elements in the long form periodic table), having a crystal structure of ZrCuSiAs type (space group P4/nmm) and which become superconductors by doping trivalent cations or divalent anions.

9 Claims, 4 Drawing Sheets

AFTMPn

U.S. PATENT DOCUMENTS

| | | | | |
|---|---|---|---|---|
| 5,426,092 | A | * | 6/1995 | Ovshinsky et al. ............ 505/461 |
| 5,482,917 | A | * | 1/1996 | Subramanian ................ 505/123 |
| 2009/0042058 | A1 | | 2/2009 | Hosono et al. |

FOREIGN PATENT DOCUMENTS

| | | |
|---|---|---|
| JP | 2002-211916 A | 7/2002 |
| JP | 2004-262675 A | 9/2004 |
| JP | 2005-350331 A | 12/2005 |
| JP | 2007-320829 A | 12/2007 |
| JP | 2009-234847 A | 10/2009 |
| WO | 2006/098432 A1 | 9/2006 |

OTHER PUBLICATIONS

Matsuishi, Satoru et al. "Superconductivity Induced by Co-Doping in Quaternary Fluoroarsenide," Journal of the American Chemical Society, 2008, vol. 130, pp. 14428-14429, cited in ISR.

Kamihara, Yoichi et al. "Iron-Based Layered Superconductor: LaOFeP," Journal of the American Chemical Society, Jul. 15, 2006, vol. 128, No. 31, pp. 10012-10013, cited in spec.

Kamihara, Yoichi et al. "Iron-Based Layered Superconductor La[O1-xFx]FeAs (x=0.05012) with Tc = 26K," Journal of the American Chemical Society, Feb. 23, 2008, vol. 130, No. 11, pp. 3296-3297, cited in spec.

Maeno, Y. et al. "Superconductivity in a layered perovskite without copper," Letters to Nature, Dec. 8, 1994, vol. 372, pp. 532-534, cited in spec.

Nagamatsu, Jun et al. "Superconductivity at 39K in magnesium diboride," Letters to Nature, Mar. 1, 2001, vol. 410, pp. 63-64, cited in spec.

Takada, Kazunori et al. "Superconductivity in two-dimensional $CoO_2$ layers," Letters to Nature, Mar. 6, 2003, vol. 422, pp. 53-55, cited in spec.

Takahashi, Hiroki et al. "Superconductivity at 43K in an iron-based layered compound LaO1-xFxFeAs," Letters to Nature, May 15, 2008, vol. 453, pp. 376-378, cited in spec.

Torrance, J.B. et al. "Properties that change as superconductivity disappears at high-doping concentrations in $La_{2-x}Sr_xCuO_4$," Physical Review B40, 1989, vol. 40, Issue 13, pp. 8872-8877, cited in spec.

Watanabe, Takumi et al. "Nickel-Based Oxyphosphide Superconductor with a Layered Crystal Structure, LaNiOP," Inorganic Chemistry, Jun. 19, 2007, vol. 46, pp. 7719-7721, cited in spec.

International Search Report of PCT/JP2009/062500, mailing date Sep. 29, 2009.

Tsuda, Tadao et al. "Electric Conductive Oxides," Shokabo, 1993, pp. 350-452, cited in spec.

Maekawa, Sadamichi, Oyobutsuri, 2006, vol. 75, No. 1, pp. 17-25, cited in spec.

Yanagi, Hiroshi et al. Proceedings of the 55th Spring Meeting of The Japan Society of Applied Physics and Related Societies, Mar. 27-30, 2008, No. 1, p. 288, cited in spec.

* cited by examiner

Diffraction angle: 2θ (degree)

LAYERED COMPOUND, SUPERCONDUCTOR AND METHOD FOR PRODUCING SAME

FIELD

This invention relates to a layered compound having a transition metal (at least an element selected from the group consisting of Fe, Ru, Os, Ni, Pd and Pt) in a skeletal structure, a superconductor comprising the layered compound and a manufacturing method of the layered compound.

BACKGROUND

Since the discovery of the high temperature superconductors (perovskite type copper oxides), research of materials aiming a room temperature superconductor has been actively performed. As a result, a superconductor having a superconductive transition temperature (Tc) over 100K has been found.

There has been a progress in understanding of the formation mechanism of the superconductivity in the perovskite type copper oxides (for example, non-patent references 1 and 2.) On the other hand, compounds that include transition metal ions other than copper, or new compounds such as $Sr_2RuO_4$ (Tc=0.93 K) (Non-patent reference 3), Magnesium diboride (Tc=39 K) (Non-patent reference 4, Patent reference 1) and $Na_{0.3}CoO_2 \cdot 1.3H_2O$ (Tc=5K) (Non-patent reference 5, Patent reference 2 and 3) have been newly found.

Strongly correlated electron system compounds having large interaction energy between conductive electrons compared to conduction band width, are known to have high possibilities to be superconductors having high superconductive transition temperatures. The strongly correlated electron system has been realized by layered compounds having transition metal ions at the skeletal structure. Most of such layered compounds belong to Mott-insulator, where antiferromagnetic interaction operates between electron spins in a way to align them antiparallel.

However, for example, in $La_2CuO_4$ which belongs to the perovskite type copper oxides, when $Sr^{2+}$ ions are added at $La^{3+}$ sites to form $La_{2-x}Sr_xCuO_4$, the itinerant electron state exhibiting metallic conduction is observed for x values within a range from 0.05 to 0.28, where superconductive state is observed at a low temperature and maximum Tc=40 K has been reported at x=0.15 (non-patent reference 6).

Recently, the inventors of the present application, found that a new strongly correlated electron compound having Fe as main component, LaOFeP and LaOFeAs can be superconductors, and applied as a patent (patent reference 4 and non-patent reference 7.) In the strongly correlated electron system, the itinerant electron state which exhibits metallic conduction is realized when a number of d-electrons takes a specific value, where transition to superconductive state occurs below a specific temperature (superconductivity transition temperature) when temperature is lowered. Further, the transition temperature of this superconductor varies from 5 K to 40 K, depending on numbers of conductive carriers. While in conventional superconductors such as Hg, $Ge_3Nb$, the formation mechanism of the superconductivity has been attributed to the electron pair (Cooper pair) due to a thermal perturbation (BCS mechanism), in the strongly correlated electron system, the formation mechanism of the superconductivity has been attributed to the electron pair due to thermal perturbation of electron spins.

The inventors of the present application further found a superconductor comprising a strong electron correlation compound represented by LnTMOPn [here, Ln is at least one selected from a group consisting of Y and lanthanide elements (La, Ce, Pr, Nd, Sm, Eu, Gd, Tb, Dy, Ho, Er, Tm, Yb, Lu), TM is at least one selected from a group consisting of transition metal elements (Fe, Ru, Os, Ni, Pd, Pt), Pn is at least one selected from a group of pnictogen elements (N, P, As, Sb)], and filed a patent application (Patent reference 5, Non-patent reference 8-10.)

The inventors of the present application also found a superconductor in compounds represented by $A(TM)_2(Pn)_2$ [here A is at least one selected from a group consisting of the second family elements in the long from periodic table, TM is at least one selected from a group of transition metal elements consisting of Fe, Ru, Os, Ni, Pd and Pt, and Pn is at least one selected from a group of the $15^{th}$ family elements (pnictogen elements) in the long form periodic table], and filed a patent application (patent reference 6, non-patent reference 11.)

REFERENCES

Non-Patent References

Non-patent reference 1: Tadao Tsuda, Keiichiro Nasu, Atsushi Fujimori, Norikazu Shiratori, "Electric conductive oxides," pp. 350-452, Shokabo, 1993, Non-patent reference 2: Sadamichi Maekawa, Oyo Butsuri, vol. 75, No. 1, pp. 17-25, 2006, Non-patent reference 3, Y. Maeno, H. Hashimoto, K. Yoshida, S. Nishizaki, T. Fujita, J. G. Bednorz, F. Lichtenberg, Nature, 372, pp. 532-534 (1994), Non-patent reference 4: J. Nagamatsu, N. Nakagawa, T. Muranaka, Y. Zenitani, J. Akimitsu, Nature, 410 pp. 63-64, (2001), Non-patent reference 5: K. Takada, H. Sakurai, E. Takayama-Muromachi, F. Izumi, R. A. Dilanian, T. Sasaki, Nature, 422, pp. 53-55, (2003), Non-patent reference 6: J. B. Torrance et al., Phys. Rev., B40, pp. 8872-8877, (1989), Non-patent reference 7: Y. Kamihara et al., J. Am. Chem. Soc., 128 (31), pp. 10012-10013, (2006), Non-patent reference 8: T. Watanabe et al., Inorg. Chem., 46 (19), pp. 7719-7721, (2007), Non-patent reference 9: Y. Kamihara et al., J. Am. Chem. Soc., 130 (11), pp. 3296-329'7, (2008)

Non-patent reference 10: H. Takahashi et al., Nature, 453, pp. 376-378, (2008),

Non-patent reference 11: Hiroshi Yanagi et al., Proceedings of the $55^{th}$ Joint Conferences of Japan Society of Applied Physics, 2008 SPRING, p. 288, March 27, (2008).

Patent References

Patent references 1: Japanese laid-open patent publication No. 2002-211916,

Patent references 2: Japanese laid-open patent publication No. 2004-262675,

Patent references 3: Japanese laid-open patent publication No. 2005-350331,

Patent references 4: Japanese laid-open patent publication No. 2007-320829,

Patent references 5: Japanese patent application No. 2008-035977,

Patent references 6: Japanese patent application No. 2008-082386.

SUMMARY

Problems to be Solved

There has been a strong expectation of the discovery of the room temperature superconductor in order to expand the application of superconductive technology. While, a high temperature superconductor having the transition temperature over 100K has been discovered in layered perovskite type copper oxides, the room temperature superconductor has not been found. One of the measures to develop the room temperature superconductor would be to find out a new group of layered compounds having transition metal elements at skeletal structure instead of perovskite type copper oxides, and to discover compound compositions that can realize the room temperature superconductor, by optimizing material parameters such as electron density, lattice constant and so on, aiming to realize higher transition temperatures.

Measures to Solve the Problems

The inventors of the present application realized a superconductor in a layered compound represented by AF(TM)Pn. The superconductors of the present invention are provided by non-oxide system layered compounds represented by a chemical formula AF(TM)Pn. In the formula, A is at least one selected from a group consisting of the $2^{nd}$ family elements in the long form periodic table, F is a fluorine ion, TM is at least one selected from a group of transition metal elements consisting of Fe, Ru, Os, Ni, Pd, and Pt, and Pn is at least one selected from a group consisting of the $15^{th}$ family elements (pnictogen elements) in the long form periodic table.

By doping trivalent cations in the above layered compounds, electrons can be generated in AF layer, where further the electrons moves to (TM)Pn layer. On the other hand, by doping divalent anions at F-sites of the above layered compounds, holes are generated, where the holes moves to (TM)Pn layer and modifies the hole density of the layer.

In other words, the present invention is (1) a layered compound characterized in that the layered compound is represented by chemical formula AF(TM)Pn (wherein, A is at least one selected from a group consisting of the second family elements in the long form periodic table, F is a fluorine ion, TM is at least one selected from a group of transition metal elements consisting of Fe, Ru, Os, Ni, Pd, and Pt, and Pn is at least one selected from a group consisting of the $15^{th}$ family elements in the long form periodic table), that the layered compound has a crystal structure of ZrCuSiAs type (space group P4/nmm) and that the layered compound becomes superconductors by doping trivalent cations or divalent anions.

Further, the present invention is (2) the layered compound (1) above described, further characterized in that A is at least one selected from a group consisting of Ca and Sr, TM is either Ni or Fe, and Pn is at least one selected from a group consisting of P, As and Sb.

Further, the present invention is (3) a superconductor characterized in that including ions of an element selected from a group consisting of Sc, Y, La, Nd and Gd, doped as trivalent cations to the layered compound (1) of above described.

Further, the present invention is (4) a superconductor characterized in that including ions of an element selected from a group consisting of O, S, and Se, doped as divalent anions to the layered compound (1) of above described.

Further, the present invention is (5) a method of manufacturing the above described layered compounds (1), wherein the method is characterized in that mixing powder of element A, powder of TM element, powder of Pn element and powders of fluorine compounds of those elements as materials, and that sintering the mixed powders at 900 to 1200 deg C. in an inert gas ambient or in a vacuum.

Further, the present invention is (6) a method of manufacturing a superconductor of above (3), wherein the method is characterized in that mixing powder of A element, powder of TM element, powder of Pn element, powders of fluorine compounds of those elements and powder of element of the trivalent cations or powder of fluorine compounds of element of the trivalent cations as materials, and that sintering the mixed powders at 900 to 1200 deg C. in an inert gas ambient or in vacuum.

Further, the present invention is (7) a method of manufacturing a superconductor of the above described (4), wherein the method is characterized in that mixing powder of A element, powder of TM element, powder of Pn element, powders of fluorine compounds of those elements as materials, further adding and mixing at least one powder of oxide of A element, sulfide of A element, selenide of A element, sulfur, and selenium, and that sintering the mixed powders at 900 to 1200 deg C. in an inert gas ambient or in vacuum.

Advantageous Effect of the Invention

The present invention provides a new group of compounds comprising pnictides including specific transition metals, type-II superconductors having Tc over 20K, which are different from known high temperature superconductors. The compound superconductors have a large tolerance against humidity of sintering ambient since materials do not include oxides. Further the sintering temperature in order to form the compounds after the mixing of the materials may be lowered. Further the compounds may be produced without using a high pressure synthesis. All those are beneficial for low cost manufacturing.

EMBODIMENTS OF THE INVENTION

Figure 1:
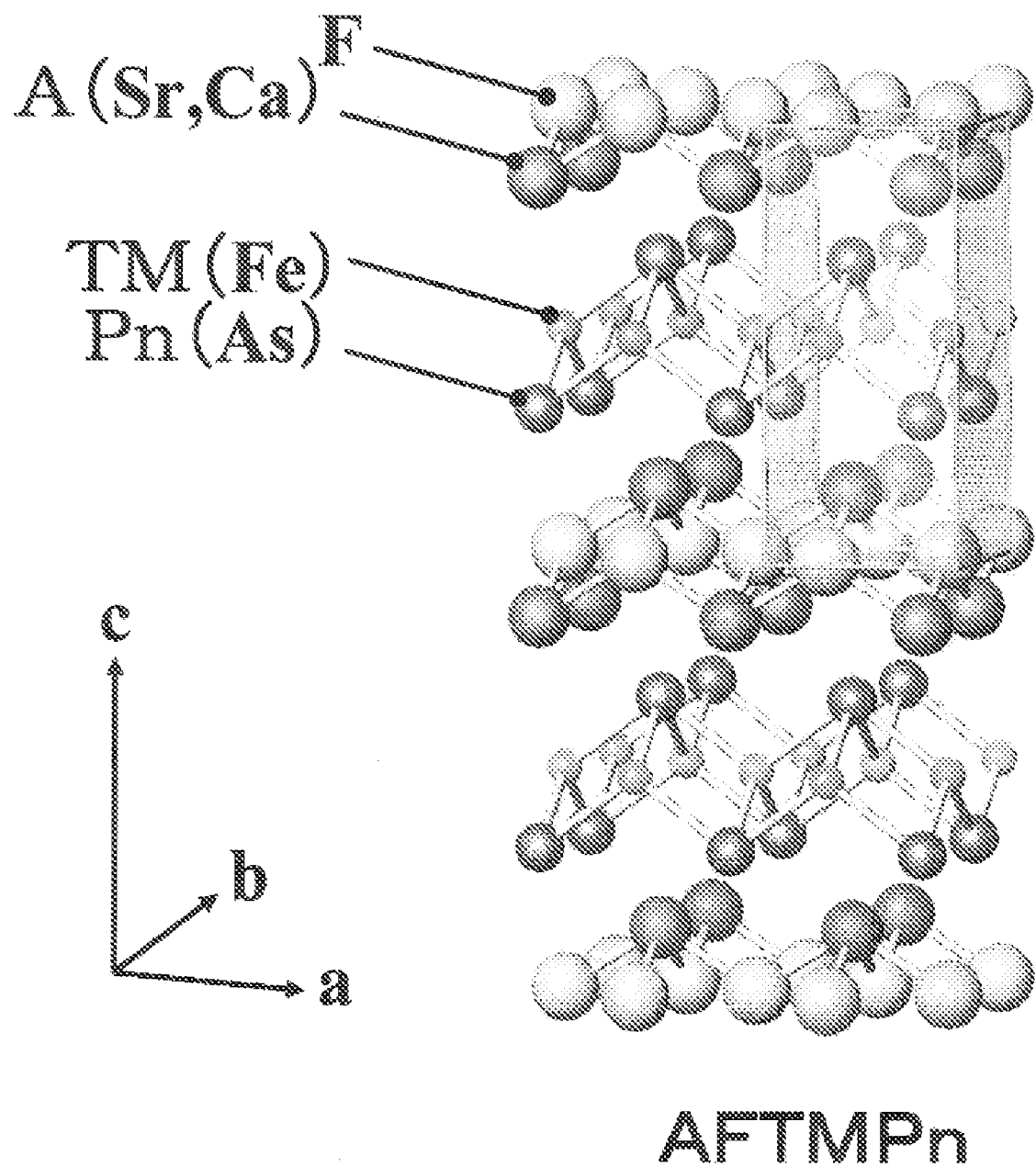
FIG. 1 is a model diagram of crystalline structure of the layered compound which provides the superconductor of the present invention.

FIG. 1 presents a model diagram for crystalline structure of the layered compound represented by AF(TM)Pn, which provides the superconductor of the present invention. The compound represented by AF(TM)Pn has a structure where (TM)Pn layer which is a conductive layer and AF layer which is an insulating layer overlaps one after the other. A part of electrons have moved from AF layer to (TM)Pn layer, causing charging of AF layer to plus and (TM)Pn layer to minus and ion coupling of the both layers. (TM)Pn layer has a structure where four tetrahedrals of (TM) (Pn) coupled edge-sharing and thus has strong two dimensional characteristics.

Further, 3d electros of (TM) have a large tendency as itinerant electrons, and thus their magnetic moment is remarkably reduced compared with free ions. The strong two dimensional characteristics and the reduced magnetic moment contribute advantageously to onset of superconductivity. Fluorine ion included in AF layer makes it easier to constitute chemical composition of stoichiometry. Further A is a divalent metal ion (cation), thus by replacing a part of A by trivalent cations such as $La^{3+}$, electrons can be easily generated. Also, holes can be easily generated by doping divalent anions such as O, S or Se ion at F site.

The element A of the compound represented by the chemical formula AF(TM)Pn, which is the $2^{nd}$ family elements in the long form periodic table, may be Be, Mg, Ca, Sr, Ba and Ra. Ca, Sr and their mixed crystal are preferred because they can generate electrons by the difference in the electronegativities and because the mixed crystal can be formed in all composition range. TM is at least one selected from a group of the transient metal elements consisting of Fe, Ru, Os, Ni, Pd and Pt, where those transient metals have a common feature that the d electron numbers are even and the magnetic moment can be almost zero, and where Fe and Ni are preferred because main quantum number is minimum (=3) and effective mass of electrons are not so large.

Pn is at least one selected from a group of the $15^{th}$ elements of the long form periodic table, in other words, from a group consisting of N, P, As, Sb and Bi, where they are called as pnictogen elements. Examples of the compounds represented by the chemical formula AF(TM)Pn would include SrFFeAs, CaFFeAs, and (SrCa) FFeAs and so on.

Doping of trivalent cations to the A metal sites of the compound represented by the chemical formula AF(TM)Pn generates electrons at the AF layer, where the electrons moves to the (TM)Pn layer. The superconductivity occurs when the electron concentration at (TM)Pn layer exceeds a threshold value. The concentration of the trivalent cations at which the superconductivity appears is 8 to 30 atomic % against A metal, preferably 10 to 20 atomic %, where about 15 atomic % gives the highest value of the transition temperature to the superconductivity (Tc).

The trivalent cations may include ions of Sc, Y and lanthanide (atomic number 57 to 71), which belong to the third family elements of the long form periodic table. Among the lanthanide elements, La, Nd and Gd are preferred since they have ion radii close to that of A metal ion. Concrete compounds include for example, SrFFeAs:La, SrFFeAs:Nd, (SrCa)FFeAs:Gd, Sr(FO)FeAs and so on. In addition, the trivalent cations may be ions of B, Al, Ga, In and Tl, which belong to the elements of the thirteenth family of the long form periodic table.

Conversely, by replacing F ions by divalent anions, for example, in Sr(FO)FeAs and so on, holes are generated and the holes move to the (TM)Pn layer. When the hole concentration in the (TM)Pn layer exceeds a threshold value, the superconductivity appears. The concentration of the divalent ions at which the superconductivity emerges is around 5 to 40 atomic % against the A metal, preferably 10 to 30%, where about 20 atomic % gives the highest of the transition temperature (Tc).

In addition, the layered compound of the present invention may be manufactured through synthesis of polycrystalline sintered body of AF(TM)Pn, by mixing as materials powder of A element, powder of TM element, powder of Pn element and powders of fluoride of those elements or preferably powders of inorganic fluoride of those elements and then by thermally sintering the mixed powders in an inert gas ambient or in vacuum. For example, in the synthesis of SrFFeAs, each powder of Sr, Fe, As and $SrF_2$ shall be mixed by dry blending to constitute atomic ratio for Sr:F:Fe:As be 1:1:1:1, then the mixed powders are thermally sintered in an inert gas ambient or in vacuum, at 900 to 1200 deg C. for 24 to 48 hours. Water in the material or in the ambient gas of the sintering needed to be removed as much as possible since it generates different phases. A sintered body having about 80% density may be obtained by the sintering. The sintered body includes many thin single crystals with square shape of about 50 micron on a side.

The sintering may preferably be temporarily made at a rather low temperature and then be made at a higher temperature in reducing the different phases. In addition, in order to realize the phase of complete AF(TM)Pn having the superconductivity, it is preferable to smash the sintered body to form powder and then to sinter the powder again in realizing a single phase. The sintering reaction can be expressed as;

$$Sr+2Fe+2As+SrF_2 \rightarrow 2SrFFeAs$$

In order to dope the trivalent cations to the layered compound of the present invention, metal powder of the trivalent cation element or fluoride of the trivalent cation element, for example, $LaF_3$, may be added to the powders of the material so that La as trivalent cation constitutes 8 to 30 atomic % against A metal, and then be mixed to go through the same thermal reaction process as described above.

In order to dope the divalent anions to the layered compound of the present invention, compound of A metal and a divalent anion such as powder of oxide of A element, powder of sulfide of A element or selenide of A element, or powders of divalent anions such as powder of sulfur, or powder of selen may be added to the powders of materials and then be mixed to go through the same thermal reaction process as described above. For example, when A metal is Ca, powders of CaO, CaS or CaSe may be added to the powders of materials so that divalent anions O, S or Se constitutes 5 to 40 atomic % against Ca metal.

Embodiment 1

Detail of the present invention is described below according with embodiments.

Example 1 for Synthesis of SrFFeAs

Powders of Sr (particle diameter 10 to 500 μm), Fe (particle diameter 1 to 100 μm), As (particle diameter 1 to 100 μm), $SrF_2$ (particle diameter 1 to 100 μm) were dry blended to constitute atomic ratio of Sr:F:Fe:As be 1:1:1:1 by using a mortar in the glove box having oxygen concentration less than 0.1 ppm and humidity of 0.01%. A mixture of about 1 gram was temporarily sintered in vacuum at 400 deg C. for 12 hours, then sintered at 1000 deg C. for 12 hours. The sintered body was crushed to form powder having particle diameter of 5 to 100 micron. Then, the powder obtained was sealed in a vessel and sintered in vacuum at 1000 deg C. for 12 hours.

Figure 2:
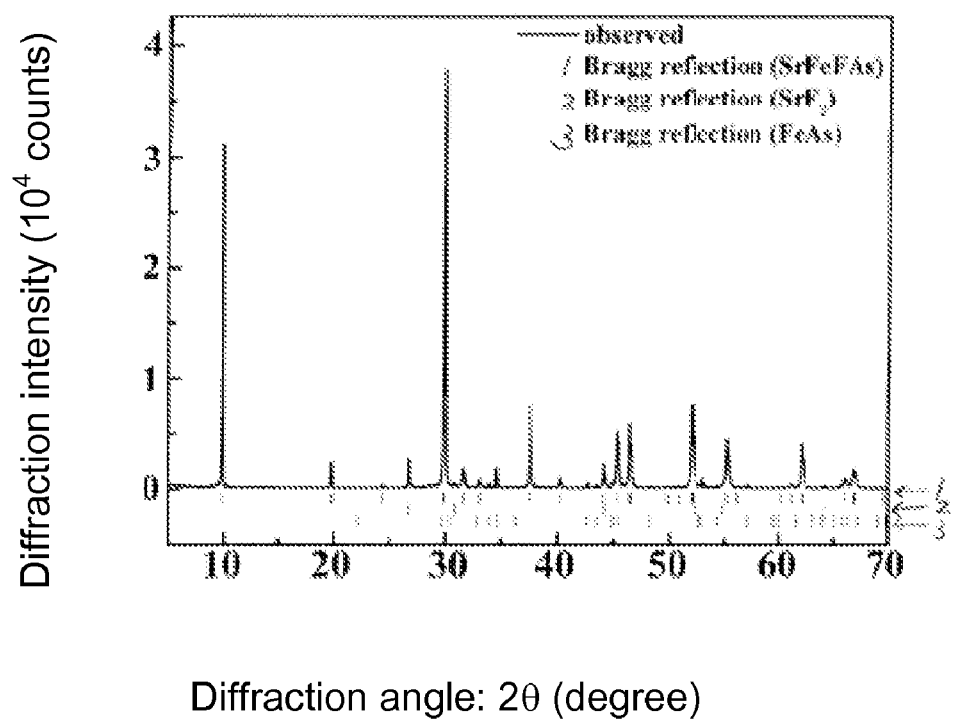
FIG. 2 is an X-ray diffraction pattern for the sintered body obtained in the synthesis example 1 of the embodiment 1.
Figure 3:
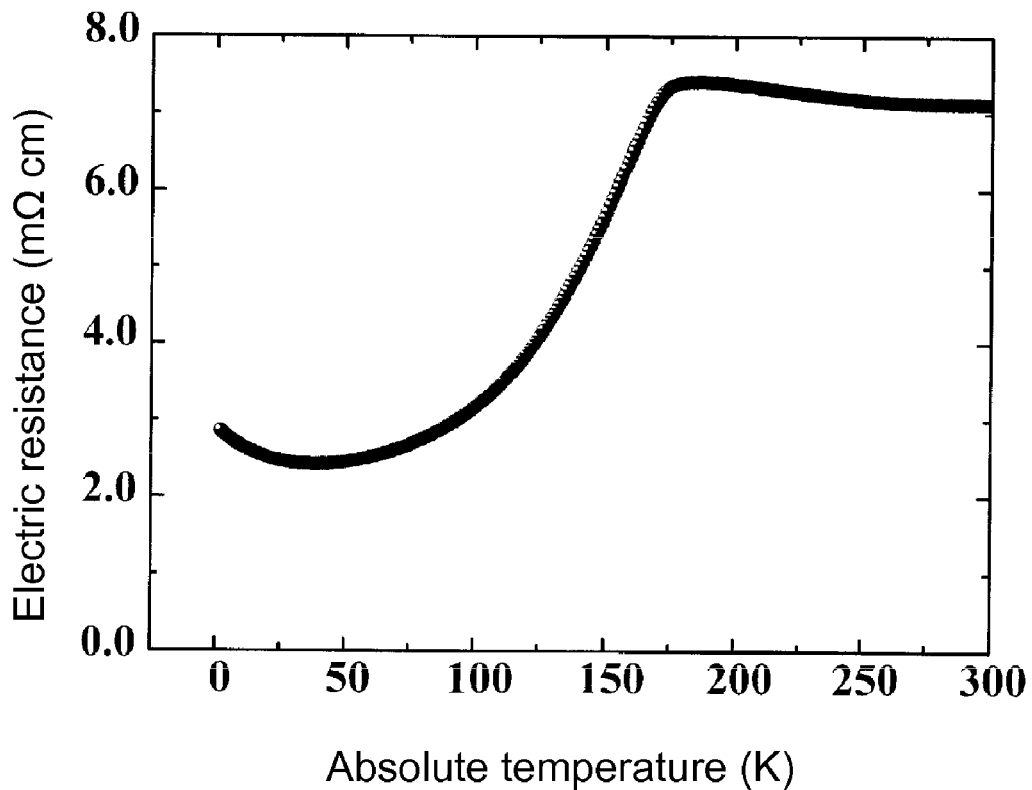
FIG. 3 is a diagram indicating temperature dependence of electric resistance for the sintered body obtained in the synthesis example 1 of the embodiment 1.
Figure 4:
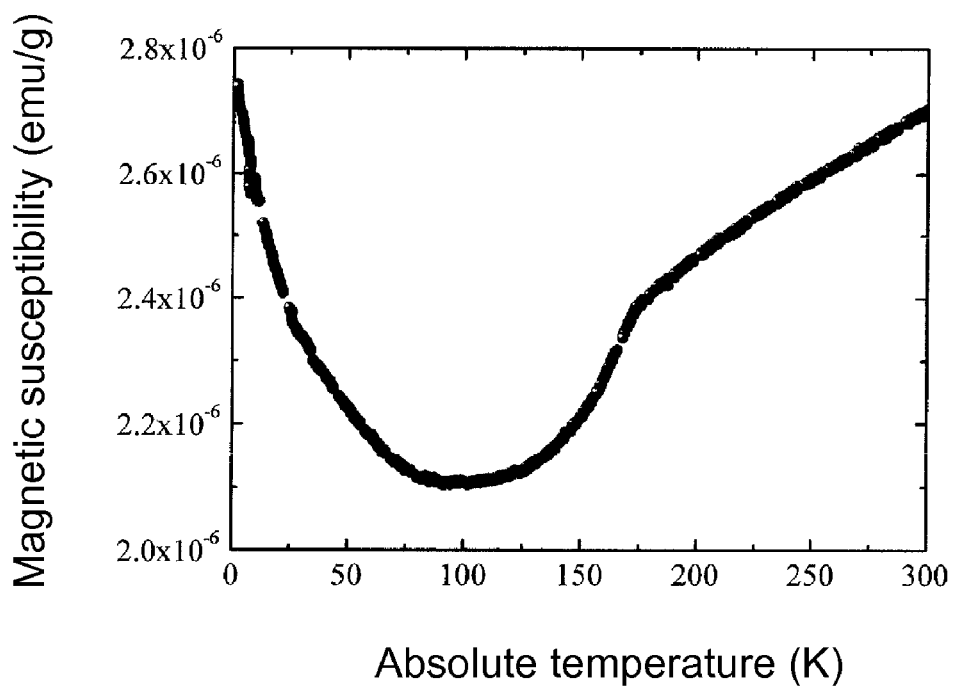
FIG. 4 is a diagram indicating temperature dependence of magnetic susceptibility for the sintered body obtained in the synthesis example 1 of the embodiment 1.

The obtained sintered body was confirmed to be SrFFeAs from the X-ray diffraction (XRD) shown in FIG. 2. FIG. 3 indicates measured results of electric resistance for SrFFeAs prepared as above, for the range of 2 K to 300 K, where the measurement was performed with the four terminal method using electrodes formed by silver past. FIG. 4 indicates the temperature dependence of magnetic susceptibility. Superconductivity cannot be confirmed, although lowering of electric resistance is observed around 170 K.

Synthesis of La Doped SrFFeAs

By adding La metal powder (particle diameters 10 to 500 μm) to the mixed powder of the materials of above example 1, prepared three types of mixed powders having La doped levels against Sr metal of 5 atomic %, 10 atomic %, and 20 atomic % for each and sintered in the same conditions as above example 1, to form three types of sintered bodies of SrFFeAs:La.

Figure 5:
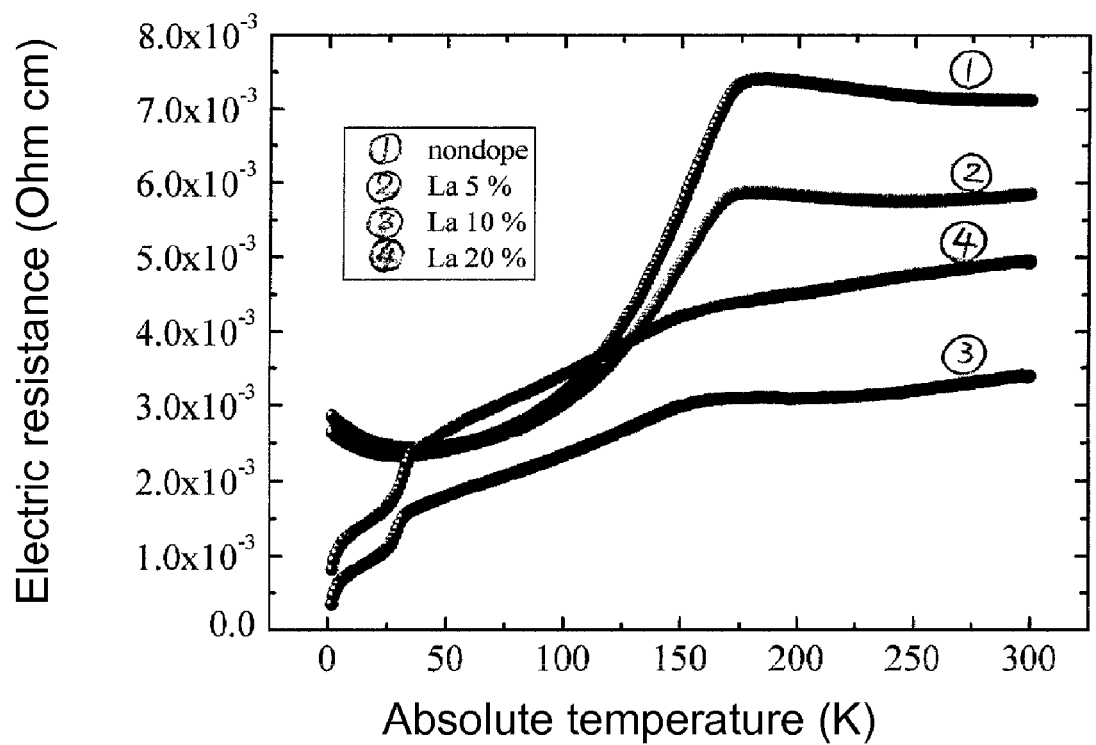
FIG. 5 is a diagram indicating temperature dependences of electric resistances for the sintered body with La doping and for one without doping obtained in the embodiment 1.
Figure 6:
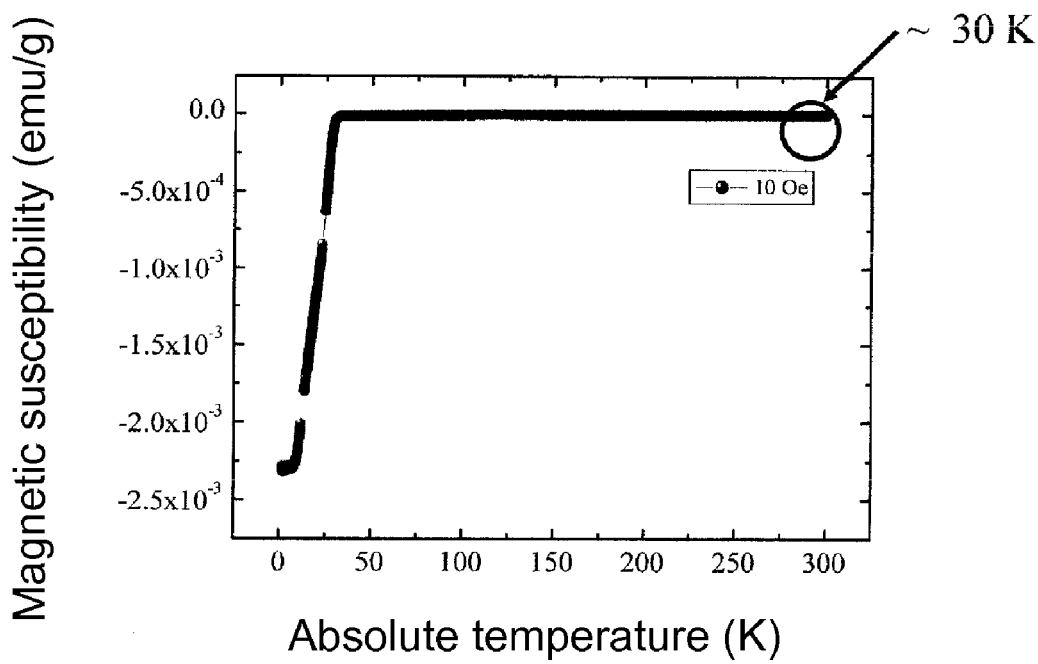
FIG. 6 is a diagram indicating temperature dependence of magnetic susceptibility for the sintered body with La doping at 10 atomic mole percent obtained in the embodiment 1.

FIG. 5 indicates measured results on electric resistance of La doped SrFFeAs prepared as above, for the range of 2 K to 300 K, where the measurement was performed with the four terminal method using electrodes formed by silver past. In the samples including 10 atomic % La and 20 atomic % La, the abrupt decrease of the electric resistance was observed around 30K. FIG. 6 indicates the temperature dependence of magnetic susceptibility for the sintered body of SrFFeAs with doping of 10 atomic % of La. The results show that the transition temperature of the superconductivity is about 30 K.

INDUSTRIAL APPLICABILITY

Non-oxide system layered compounds of the present invention are tolerant of humidity of the ambient gas for the sintering since the materials do not include oxides, and also offer the type-II superconductors with Tc over 20 K, which can be easily manufactured because of low sintering temperature. The superconductors of the present invention will have applications such as wires for small motors and magnet for NMR-CT in combination with circulation type cooling machine.

What is claimed is:

1. A layered compound represented by chemical formula:

AF(TM)Pn wherein A is at least one selected from a group consisting of the $2^{nd}$ family elements in the long form periodic table, F is a fluorine ion, TM is at least one selected from a group of transition metal elements consisting of Fe, Ru, Os, Ni, Pd, and Pt, and Pn is at least one selected from a group consisting of the $15^{th}$ family elements in the long form periodic table, and wherein the layered compound has a crystal structure of ZrCuSiAs type (space group P4/nmm) and that the layered compound becomes superconductive by doping trivalent cations or divalent anions.

2. The layered compound of claim 1, wherein A is at least one selected from a group consisting of Ca and Sr, TM is either Ni or Fe, and Pn is at least one selected from a group consisting of P, As, and Sb.

3. The layered compound of claim 1, wherein the layered compound is doped with a trivalent cation of an element selected from a group consisting of Sc, Y, La, Nd, and Gd.

4. The layered compound of claim 1, wherein the layered compound is doped with a divalent anion of an element selected from a group consisting of O, S, and Se.

5. A method of manufacturing a layered compound represented by chemical formula: AF(TM)Pn, wherein A is at least one selected from a group consisting of the $2^{nd}$ family elements in the long form periodic table, F is a fluorine ion, TM is at least one selected from a group of transition metal elements consisting of Fe, Ru, Os, Ni, Pd, and Pt, and Pn is at least one selected from a group consisting of the $15^{th}$ family elements in the long form periodic table, and wherein the layered compound has a crystal structure of ZrCuSiAs type (space group P4/nmm) and that the layered compound becomes superconductive by doping trivalent cations or divalent anions, the method comprising:

mixing powders of element A, TM element, Pn element, and at least one fluorine compound selected from a group consisting of fluorine compounds of element A, fluorine compounds of TM element, and fluorine compounds of Pn element, and sintering the mixed powders at 900 to 1200 deg C. in an inert gas ambient or in a vacuum.

6. The method according to claim 5, wherein the layered compound is doped with a trivalent cation of an element selected from a group consisting of Sc, Y, La, Nd, and Gd, and in the mixing step, the powders include powder of element of the trivalent cations cation or powder of fluorine compound of element of the trivalent cation.

7. The method according to claim 5, wherein the layered compound is doped with a divalent anion of an element selected from a group consisting of O, S, and Se, and in the mixing step, the powders include at least one powder of oxide of A element, sulfide of A element, selenide of A element, sulfur, and selenium.

8. A super conductor comprised of the layered compound according to claim 3.

9. A super conductor comprised of the layered compound according to claim 4.

* * * * *